US011208110B2

United States Patent
Stefan et al.

(10) Patent No.: US 11,208,110 B2
(45) Date of Patent: Dec. 28, 2021

(54) METHOD FOR MODELING A MOTOR VEHICLE SENSOR IN A VIRTUAL TEST ENVIRONMENT

(71) Applicant: FORD GLOBAL TECHNOLOGIES, LLC, Dearborn, MI (US)

(72) Inventors: Frederic Stefan, Aachen (DE); Alain Marie Roger Chevalier, Henri-Chapelle (BE); Michael Marbaix, Haillot (BE); Evangelos Bitsanis, Aachen (DE)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 640 days.

(21) Appl. No.: 16/050,567

(22) Filed: Jul. 31, 2018

(65) Prior Publication Data
US 2019/0039625 A1 Feb. 7, 2019

(30) Foreign Application Priority Data
Aug. 1, 2017 (DE) .................. 10 2017 213 214.0

(51) Int. Cl.
*B60W 50/02* (2012.01)
*B60W 50/04* (2006.01)
(Continued)

(52) U.S. Cl.
CPC ........ *B60W 50/0205* (2013.01); *B60W 50/04* (2013.01); *G06F 30/15* (2020.01);
(Continued)

(58) Field of Classification Search
CPC ............ B60W 50/0205; B60W 50/04; B60W 2050/0037; B60W 2050/0215; G06F 30/20; G06F 30/15
(Continued)

(56) References Cited

U.S. PATENT DOCUMENTS 8,705,792 B2 4/2014 James et al.
8,723,866 B2 * 5/2014 Buyanovskiy .......... G06T 15/06
345/426

(Continued)

OTHER PUBLICATIONS

Li, Yaxin et al., "LiDAR Sensor Modeling for ADAS Applications under a Virtual Driving Environment", SAE Technical Paper 2016—Jan. 1907, Sep. 2016 (Year: 2016).*
Bennewitz, Maren et al. "Utilizing Reflection Properties of Surfaces to Improve Mobile Robot Localization", 2009 IEEE International Conference on Robotics and Automation, May 12-17, 2009 (Year: 2009).*

(Continued)

*Primary Examiner* — Kamini S Shah
*Assistant Examiner* — John E Johansen
(74) *Attorney, Agent, or Firm* — Frank Lollo; Brooks Kushman P.C.

(57) ABSTRACT

The disclosure relates to a method that models a motor vehicle sensor in a virtual test environment by way of definition. Using a sensor support, a raycast distribution shape, a group of raycast properties, a raycast reflection factor, and a raycast echo, a sensor in reality may be tested in a virtual environment to calibrate the sensor in reality. The sensor support is a virtual sensor support for a virtual sensor model, which forms a three-dimensional or two-dimensional avatar of the sensor in reality, in the virtual test environment. The sensor support has a sensor starting point that is used as an origin for a raycast distribution shape. The method extracts a special application of the sensor in reality in an application case, which is particularly useful for testing scenarios.

2 Claims, 1 Drawing Sheet

(51) Int. Cl.
  *B60W 50/00* (2006.01)
  *G06F 30/15* (2020.01)
  *G06F 30/20* (2020.01)
(52) U.S. Cl.
  CPC ..... *G06F 30/20* (2020.01); *B60W 2050/0037* (2013.01); *B60W 2050/0215* (2013.01)
(58) Field of Classification Search
  USPC .......................................................... 703/8
  See application file for complete search history.

(56) References Cited

U.S. PATENT DOCUMENTS

| | | |
|---|---|---|
| 9,176,662 B2 | 10/2015 | Wilensky et al. |
| 2009/0300422 A1 | 12/2009 | Grinchnick et al. |
| 2016/0210775 A1 | 7/2016 | Alaniz et al. |
| 2016/0236683 A1 | 8/2016 | Eggert et al. |

OTHER PUBLICATIONS

Bechtold S. et al. "HELIOS: A Multi-Purpose LiDAR Simulation Framework for Research, Planning and Training of Laser Scanning Operations With Airborne, Ground-Based Mobile and Stationary Platforms", ISPRS Annals of the Photogrammetry, Remote Sensing and Spatial Information Sciences, vol. III-3 (Year: 2016).*
Miller, Christian Kurtz. A Simulation and Regression Testing Framework for Autonomous Vehicles. Case Western Reserve University. Aug. 2007. 119 pages.
Goodin, C. et al. "Sensor modeling for the Virtual Autonomous Navigation Environment." Sensors, 2009 IEEE. 2009., pp. 1588-1592.
Bostelman, Roger et al., "Safe Control of Manufacturing Vehicles Research Towards Standard Test Methods", National Institute of Standards and Technology, Jun. 7, 2012.

* cited by examiner

METHOD FOR MODELING A MOTOR VEHICLE SENSOR IN A VIRTUAL TEST ENVIRONMENT

CROSS-REFERENCE TO RELATED APPLICATIONS

This application claims foreign priority benefits under 35 U.S.C. § 119(a)-(d) to DE Application 10 2017 213 214.0 filed Aug. 1, 2017, which is hereby incorporated by reference in its entirety.

TECHNICAL FIELD

The disclosure relates to a method to model a motor vehicle sensor in a virtual test environment, in particular a three-dimensional test environment.

BACKGROUND

Virtual testing and virtual development have become required methods for development of design features for automated driving. One key element of such virtual simulations is use of models of virtual sensors in a virtual test environment. There are many ways of modeling virtual sensors (ideal behavior, statistical model, physical model, phenomenological model, etc.).

The design and testing of the associated software is faced with new demands with the appearance of design features for automated driving and autonomously driving motor vehicles. Because of the nature of the algorithms used to implement automated driving, a large number of tests are required to validate corresponding software. On the one hand, preparation of real prototypes and test environments is time-consuming and costly. On the other hand, carrying out driving tests is a cumbersome process, because of a high number of kilometers that is necessary to verify algorithms implemented in automated features. For these reasons, methods to virtually test have become more and more widespread. They enable software on a vehicle level to be tested in physics-based virtual environments and in more and more realistic environments.

One key aspect of virtual test environments is a capability of modeling sensors with different degrees of accuracy depending on requirements of a test. The modeling of the sensors is essential because the sensors are the eyes and ears of the algorithm for automated driving. Various methods have been developed to test camera-based sensors, by supplying real cameras with images from a virtual reality, which can presently be created with a very high degree of realism. For "wave-based" sensors (ultrasound, radar, lidar, laser, etc.), there are different modeling methods, for example, ideal model, statistical model, up to physical models.

The use of physical sensor models in a virtual test environment is very demanding because of complexity of such sensors. Physical sensor models require a large quantity of computing power and memory, a large amount of experience, and a virtual test environment that is capable of modeling physical events linked to wave propagation, for example, different speeds of sound depending on atmospheric conditions, interference as a result of rain, snow, trees, moving grass, etc. Moreover, a design feature for automated driving generally requires a large number of items of sensor information, which restricts use of such sensor models for virtual tests.

DE 10 2016 100 416 A1 discloses the use of a virtual environment for testing and training real sensors by means of a virtual sensor. It is proposed that calibrations processed in the virtual environment be uploaded directly to a real sensor. The use of sensor models is mentioned, but without mentioning details of how these models could be created in a formalized and systematic manner. The virtual sensor can be image-based (including "depth buffer") or raycasting-based. This does not provide an indication of the manner in which these technologies are used for modeling the sensor. Providing raw data of the virtual sensor via ray tracing is also mentioned, for example, in that a virtual lidar sensor can output a complete point cloud that a real lidar sensor can output, but without indicating how a lidar sensor would be modeled in the virtual environment.

US 2016 0 236 683 A1 proposes the use of a parameterized mathematical model for modeling sensors.

US 2009 0 300 422 A1 proposes statistical methods for generating virtual sensor data.

The NIST publication 'Safe Control of Manufacturing Vehicles Research Towards Standard Test Methods', Bostelman, R. et al., 7 Jun. 2012, proposes a method for modeling a 3D vehicle model by means of raycasting, to obtain several spatial features of this 3D model.

The publication 'A Simulation and Regression Testing Framework for Autonomous Vehicles', C. K. Miller et al., August 2007, describes a simulation and test environment for autonomous vehicles, which enables regression testing of corresponding software, i.e., checking of whether modified software still behaves at certain points like an earlier version of the software.

U.S. Pat. No. 8,705,792 discloses object tracking mechanisms and methods that use raycasting technology.

U.S. Pat. No. 9,176,662 describes how raycasts can be used to model behavior, for example, a reflection of light, in order to test camera lenses.

In the cited prior art, virtual simulations and test environments are presented and use of virtual sensors is mentioned, but not specifically described therein how the virtual sensors are to be modeled.

SUMMARY

The disclosure is based on an object to provide a systematic and generally usable method to model a virtual sensor in a virtual environment.

The disclosure provides a method to model a virtual sensor in a virtual test environment, which is based on raycasting technology, and is especially suitable to model sensors that are based on propagation of waves, for example, ultrasound, radar, lidar, laser, etc.

In particular, a method to model a motor vehicle sensor in a virtual test environment comprises definitions of a sensor support, a raycast distribution shape, a group of raycast properties, a raycast reflection factor, and a raycast echo.

The method according to the disclosure is based on raycasting, which is widespread in computer games (and in computer game development environments, so-called game engines). The core idea thereof is to depict a line of sight of a sensor in three dimensions, and depict variables such as spatial resolution, chronological resolution, velocity, etc. using a raycast distribution. The raycast distribution can be obtained either via modeling from a ground up in the virtual test environment, or by an automatic generation method based on properties of real sensors, which is the preferred implementation of the present disclosure.

The disclosure enables a virtual sensor to be modeled in a formalized and generally usable manner as an object of the virtual environment and with use of a raycasting technology as a building block.

Implementing the features of the disclosure also means modifying a nature of a raycast, which is intrinsically an instantaneous object in the virtual environment, i.e., results are available at any processing stage. A new type of sensor raycast thus results, as well as a new algorithm that is capable of decomposing data of real sensors into raycast layouts and raycast parameters.

For example, to model an ultrasonic sensor for a parking assistant, a raycast may be sent perpendicular to a three-dimensional vehicle model into the virtual environment. This would be sufficient if algorithms are to be evaluated that use a distance to a closest obstruction. However, if algorithms are to be evaluated that enable the distance to the closest obstruction to be determined on the basis of a propagation of sound waves, a simple raycast is not sufficient, and one would need not only a sensor model for a specific sensor, but rather a plurality of sensor models depending on a test case. The disclosure enables the sensor model to be adapted to individual requirements of a user.

In above-mentioned DE 10 2016 100 416 A1, the sensor behavior model is to be implemented as part of postprocessing algorithms, which access the raycast by way of a common memory.

In the disclosure, the sensor models intrinsically supply a complete spectrum of data in time and space, and a postprocessing algorithm is not necessary to obtain the data.

Thus, the disclosure develops a LIDAR sensor model in a three-dimensional environment, which provides much freedom. Thus, one could, for example, decide on a bundle of 64 raycasts that rotate as in reality at high frequency, or one could decide on a bundle of N raycasts that cover a region of 360° all around a vehicle model and are refreshed at lower frequency. A way of modeling the sensor using raycasts provides a developer with different items of information, and, therefore, results. This shows the importance of a description of how the sensor is to be modeled.

Each sensor has its specific properties, and each phase of a project requires a different sensor model. Modeling each sensor ad hoc would take a long time and force the developer to wonder from a beginning, each time, how to proceed in order to model the sensors. In contrast, the method according to the disclosure is of a general nature and can be automated. For example, an electronic assistant that guides through a process of sensor modeling and creation.

In one preferred embodiment, a sensor support is a virtual sensor support for a virtual sensor model, which forms a three-dimensional or two-dimensional avatar of a sensor in a virtual test environment, and has a sensor starting point, or a sensor starting surface, that is used as an origin for a raycast distribution shape or its raycasts.

The raycast distribution shape can be a predefined two-dimensional or three-dimensional shape, an origin of which is a starting point, or a starting surface, of the sensor support, wherein the raycast distribution shape has a plurality of evenly distributed raycasts, an origin of which is either a starting point of the sensor support, or a point in a starting plane of the sensor support.

The raycast properties are in particular a damping, a propagation speed, and a detection accuracy of raycasts.

The method is particularly suitable to model sensors that operate on electromagnetic or acoustic waves.

A description of exemplary embodiments on the basis of the drawings follows.

DETAILED DESCRIPTION

As required, detailed embodiments of the present disclosure are disclosed herein; however, it is to be understood that the disclosed embodiments are merely exemplary of the disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Figure 1:
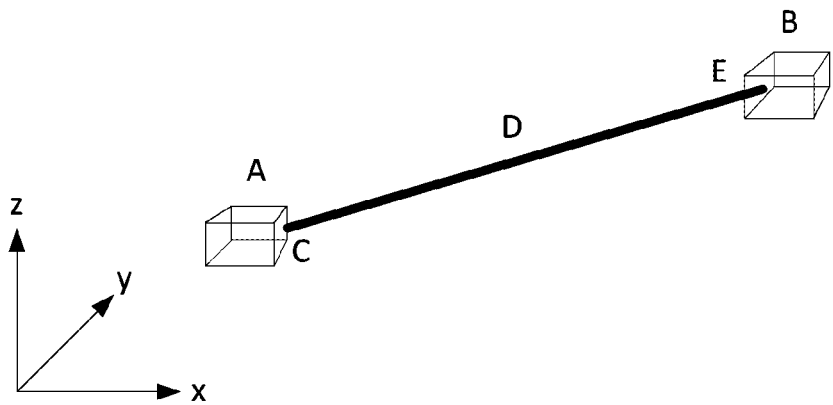
FIG. 1 shows an illustration of a raycast according the disclosure.

To explain raycasts, reference will firstly be made to FIG. 1.

In a computer game (or in a computer game development environment, a game engine), a raycast or "vision beam" is something represented by at least one vector D in three dimensions, in a three-dimensional reference coordinate system xyz, which has a specific length (up to infinite) and an application point or origin C placed on an object A. Raycasts offer a possibility of finding all objects B that are located on a trajectory thereof, which in particular enables coordinates of contact points E between the raycasts and these objects to be found. Raycasts are typically used to emulate instantaneous projectile trajectories, to ascertain visibility of objects, etc.

Figure 2:
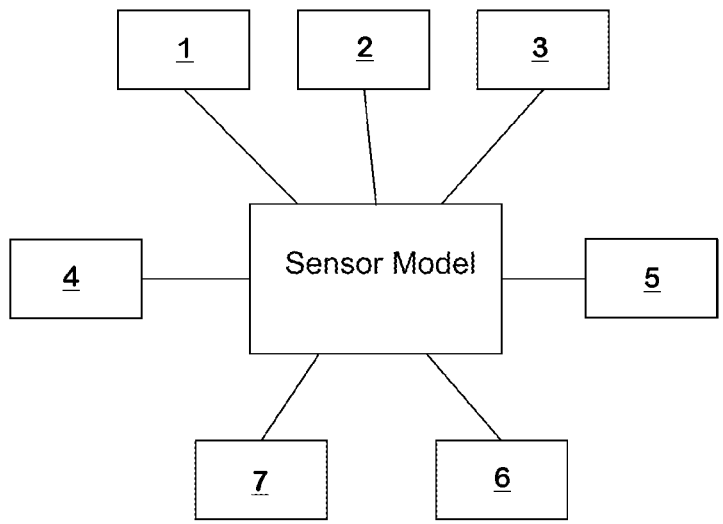
FIG. 2 shows a system overview of an interaction between parts of a sensor model according the disclosure.

The sensor model consists of the following parts illustrated in FIG. 2:

A definition of a sensor support 1.

The sensor support 1 is an "avatar" of a sensor in a virtual test environment and has the following properties:

a starting point or a starting surface (i.e., an origin) for a raycast distribution shape 2;

a 3D rotational movement as a function of time, which indicates whether the sensor can, for example, rotate at a specific angular velocity or whether the sensor is fixed.

A raycast distribution shape 2:

The raycast distribution shape 2 is a three-dimensional shape (for example, a cone, a cylinder, or a conventional volume), an origin of which is the starting point or the starting surface of the sensor support 1.

Dimensions of the raycast distribution shape 2 model a maximum range of the sensor in three-dimensional space.

The raycast distribution contains N raycasts, which are evenly distributed in the raycast distribution shape 2. The origin of each raycast is either the starting point of the sensor support 1 or a point in a starting plane of the sensor support 1.

The number of raycasts results in a spatial resolution of the sensor. They can also be used to model discretization of items of sensor information.

A definition of a raycast damping 3:

The raycast damping 3 can be identical for all raycasts of the raycast distribution shape 2 or can be specific for each raycast.

The damping 3 can be a coefficient or a formula within the raycast distribution shape 2, which specifies a percentage of original signal that would return if an object were struck by the raycast at a specific distance from the origin.

A definition of a raycast propagation speed 4:

The propagation speed 4 can be identical for all raycasts of the raycast distribution shape 2 or can be specific for each raycast.

The propagation speed 4 is used to define a delay, after which, at a distance at which the raycast strikes an object, an echo value of the raycast is available in the sensor.

The propagation speed 4 can be used for modeling a nature of waves emitted by the sensor (sound, light, electromagnetic, etc.) and of environmental influences, for example, weather, temperature, etc.

A definition of a raycast detection accuracy 5:

The detection accuracy 5 can be identical for all raycasts of the raycast distribution shape 2 or can be specific for each raycast.

The detection accuracy 5 is a correction coefficient that enables an error in the echo value of the raycast to be emulated. It is a probability that a raycast sends back an incorrect value (for example, primarily because of a lack of target, possible false alarm).

A definition of a reflection factor 6:

The definition of a reflection factor 6 is associated with objects present in the virtual test environment.

The reflection factor is a percentage that represents how well an object reflects the wave emitted by the sensor.

The reflection factor enables materials to be modeled, which only reflect weakly because of a shape, structure, nature, etc. thereof, for example, some items of clothing.

A definition of a raycast echo 7:

Each raycast can send back a collection of values, which are called an echo, namely:

a 3D coordinate, which corresponds to a point of incidence with an object (or not, if there are no hits), and an echo value lying in a range [0, . . . , 1], which is dependent on the detection accuracy 5, the value of the damping 3, the reflection factor 6 of the object struck, and on whether a hit is present or not. It can be provided by the following equation:

accuracy value=(detection accuracy)×(damping)×
(reflection factor)×(1 for a hit or otherwise 0)

Each value of a raycast echo 7 is available after a propagation time, which is determined by the propagation speed 4 defined for this raycast and a distance of the struck object from the origin of the raycast.

If necessary, it is also possible to model a sensor in only two dimensions.

Figure 3:
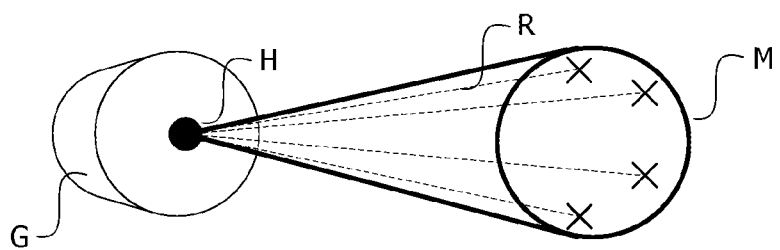
FIG. 3 shows an example of a sensor model according to an embodiment of the disclosure.

FIG. 3 shows an example of a sensor model. In FIG. 3, G is the sensor support 1, which consists of a cylinder and is a 3D avatar of the sensor, which is placed in a virtual environment and on a starting point H, which is an origin of the raycast distribution shape M. The raycast distribution shape M is a cone; the dimensions of the cone supply a maximum range of the sensor in three-dimensional space. This raycast distribution shape M contains four raycasts R, which means that this sensor can detect an object that traverses these raycasts R. For each raycast R, a damping 3, a propagation speed 4, and a detection accuracy 5 can be defined.

It is possible to generate the sensor model automatically, inter alia, based on the following:

Measurements of the sensor in reality that are analyzed by an algorithm for machine learning, which is trained to extract parameters required for modeling the sensor.

Test cases or application cases that are specified in a machine-interpretable language (for example, a pseudo-natural language) and analyzed by an algorithm, which extracts a special application of the sensor in the application case. This is particularly useful for testing error scenarios or safety-related scenarios.

Sensor data sheets, which are available in a standard format, for example, XML, and can be provided by a sensor supplier. An algorithm, for example, a serializer, can extract the parameters required for modeling the sensor from such digital data sheets.

In summary, the following methods and/or algorithms are essential:

A method for modeling a virtual motor vehicle sensor in a three-dimensional virtual environment by way of definition and use of a sensor support 1, a raycast distribution shape 2, raycast properties, in particular its damping 3, propagation speed 4, and detection accuracy 5, a raycast reflection factor 6, and a raycast echo 7, which is a returned value of the raycast.

A method for defining a virtual sensor support for a virtual sensor model, having a three-dimensional or two-dimensional avatar of the sensor in a solely graphical representation;

a sensor starting point or a sensor starting surface that is used as an origin for a raycast distribution shape or its raycasts; and a definition of a sensor support movement, which describes whether the sensor support is a fixed support or whether the sensor support can move after attachment to a virtual object (for example, as is the case with lidar or rotating radar). If the sensor can move, the associated movement is also described (for example, rotational velocity, etc.).

A method for defining a raycast distribution shape for a virtual sensor model, wherein:

the raycast distribution shape is a three-dimensional (e.g., a cone, a cylinder, or a conventional volume) or two-dimensional shape, an origin of which is the starting point or the starting surface of the sensor support;

the dimensions of the raycast distribution shape model the maximum range of the sensor in three-dimensional or two-dimensional space;

the raycast distribution contains N raycasts, which follow a specific distribution in the raycast distribution shape, typically an even distribution, wherein an origin of each raycast is either the starting point of the sensor support or a point in a starting plane of the sensor support; and the number of the raycasts results in a spatial resolution of the sensor and can also be used to model discretization of items of sensor information.

A method for defining a damping for each raycast of a raycast distribution shape, wherein:

the damping is the same for all raycasts of the raycast distribution shape or is specific for each raycast, in order to model boundaries or limit conditions;

the damping is typically expressed as a percentage in the range [0, . . . , 1]; and the damping is defined as a single value or a formula, which specifies a percentage of original signal that would return if an object were struck at a specific distance from the origin by the raycast within the raycast distribution shape.

A method for defining a raycast propagation speed, wherein:

the propagation speed is the same for all raycasts of the raycast distribution shape or is specific for each raycast;

the propagation speed is used to define a delay after which, at a distance at which a raycast strikes an object, an echo value of the raycast is available in the sensor; and the propagation speed is used to model the nature of the waves (sound, light, electromagnetic, etc.) emitted by the sensor and environmental influences, for example, weather, temperature, etc.

A method for defining a raycast detection accuracy, wherein:

a detection accuracy is identical for all raycasts of the raycast distribution shape or is specific for each raycast; and the detection accuracy is a correction coefficient that enables an error in the echo value of the raycast to be emulated. It is a probability that a raycast sends back an incorrect value (for example, primarily because of a lack of target, possible false alarm).

A method for defining a raycast detection accuracy, wherein:

a detection accuracy is the same for all raycasts of the raycast distribution shape or is specific for each raycast;

the detection accuracy is typically expressed as a percentage in the range [0, . . . , 1];

the detection accuracy is a correction coefficient that enables an error in the echo value of the raycast to be emulated (for example, it can represent a probability that a raycast sends back an incorrect value (for example, primarily because of a lack of target, possible false alarm)); and the detection accuracy is used in an early phase of a project to emulate errors that are induced by signal processing algorithms embedded in a sensor.

A method for defining an activation time pattern for each raycast of a raycast distribution shape, wherein the activation time pattern is used to specify when each raycast of a sensor is activated (e.g., all together, one after another with a specific delay, etc.).

A method for defining a reflection factor for a virtual object of a virtual sensor test, wherein:

a definition of a reflection factor is associated with a specific material, which is associated with each object in the virtual test environment;

the reflection factor is typically expressed as a percentage in the range [0, . . . , 1];

the reflection factor is a percentage that represents how well an object reflects waves emitted by the sensor; and the reflection factor enables materials to be modeled that only reflect weakly because of the shape, structure, nature, etc. thereof (for example, some pieces of clothing).

A method for defining an echo for each raycast of a sensor model, wherein:

an echo is processed for each raycast of the sensor model;

an echo is a value in the range [0, . . . , 1], which is a function of the damping value, the detection accuracy, and the reflection factor of the object struck by the raycast and of the presence of a hit;

an echo value is available after a time delay, which is a function of the raycast propagation speed and a distance of a struck object; and an echo value is associated with three-dimensional or two-dimensional coordinates of the struck object.

A method for automatically generating a virtual sensor model, wherein:

the method is an algorithm for machine learning, which is trained to extract parameters required that model the virtual sensor from measurements of the sensor in reality;

the method is an algorithm, which analyzes a test case or application case that is specified in a machine-interpretable language (for example, a pseudo-natural language), and extracts a special application of the sensor in a test case or application case (particularly useful for testing error scenarios or safety-related scenarios); and the method is an algorithm, which extracts parameters required for modeling the sensor from a sensor data sheet, which is available in a standard format (for example, XML) and is provided by a sensor supplier.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments of the disclosure.

What is claimed is:

1. A method that models a motor vehicle sensor comprising:

obtaining sensor model parameters from a plurality of physical sensor parameters to model the sensor in a virtual test environment by way of definition and use of a virtual sensor model including:

a sensor support for the sensor in the virtual test environment, and includes a sensor starting surface that is used as an origin for a raycast distribution shape, wherein the raycast distribution shape is a predefined two-dimensional or three-dimensional shape, an origin of which is a starting surface of the sensor support, wherein the raycast distribution shape has a plurality of evenly distributed raycasts, an origin of which is either the starting surface of the sensor support or a point in a starting plane of the sensor support;

wherein the group of raycast properties are a damping, a propagation speed, and a detection accuracy of raycasts, wherein the damping is the same for all raycasts use either the same predefined value or are determined using the same method and is defined as a single value that specifies a percentage of original signal that would return if an object were struck by the raycast at a specific distance from an origin, wherein the propagation speed is the same for all raycasts use either the same predefined value or are determined using the same method and defines a delay, after which, at a distance at which a raycast strikes an object, an echo value of the raycast is available in the sensor, and wherein the detection accuracy is identical for all raycasts use either the same predefined value or are determined using the same method and is a probability that a raycast sends back an incorrect value, wherein the raycast reflection factor is associated with objects present in the virtual test environment and is a percentage that indicates how well an object reflects waves emitted by the sensor, and wherein the raycast echo is a collection of coordinates and echo values sent back by each raycast, wherein the echo values are dependent on the detection accuracy, the damping, the raycast reflection factor, and whether a hit is present.

2. The method as claimed in claim 1, wherein the sensor is a sensor operative based on electromagnetic or acoustic waves.

* * * * *